United States Patent
Antonyan et al.

(10) Patent No.: US 10,777,255 B2
(45) Date of Patent: Sep. 15, 2020

(54) CONTROL SIGNAL GENERATOR FOR SENSE AMPLIFIER AND MEMORY DEVICE INCLUDING THE CONTROL SIGNAL GENERATOR

(71) Applicant: Samsung Electronics Co., Ltd., Suwon-si, Gyeonggi-do (KR)

(72) Inventors: Artur Antonyan, Suwon-si (KR); Hyun-taek Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/282,930

(22) Filed: Feb. 22, 2019

(65) Prior Publication Data

US 2019/0287603 A1    Sep. 19, 2019

(30) Foreign Application Priority Data

Mar. 19, 2018  (KR) .................. 10-2018-0031714
Sep. 17, 2018  (KR) .................. 10-2018-0111021

(51) Int. Cl.
  *G11C 11/4091*  (2006.01)
  *G11C 7/08*  (2006.01)
  *G11C 7/10*  (2006.01)

(52) U.S. Cl.
  CPC ............ *G11C 11/4091* (2013.01); *G11C 7/08* (2013.01); *G11C 7/1045* (2013.01)

(58) Field of Classification Search
  CPC ...... G11C 11/4091; G11C 7/08; G11C 7/1045
  See application file for complete search history.

(56) References Cited

U.S. PATENT DOCUMENTS

| 6,009,030 | A | 12/1999 | Seo |
| 6,738,296 | B2 | 5/2004 | Sung et al. |
| 7,499,350 | B2 | 3/2009 | Park |
| 7,622,962 | B2 | 11/2009 | Kim et al. |
| 7,639,559 | B2* | 12/2009 | Kurata ............. G11C 7/12 365/103 |
| 8,243,542 | B2* | 8/2012 | Bae ............. G11C 5/145 365/163 |
| 8,279,688 | B2 | 10/2012 | Liu |
| 8,379,430 | B2* | 2/2013 | Kitagawa ......... G11C 13/0007 365/148 |
| 8,872,938 | B2* | 10/2014 | Yoo ............. H04N 5/378 348/230.1 |
| 9,281,055 | B2 | 3/2016 | Sahu et al. |
| 9,761,285 | B1 | 9/2017 | Bringivijayaraghavan et al. |

(Continued)

FOREIGN PATENT DOCUMENTS

KR    2017-0101071 A    9/2017

*Primary Examiner* — Tri M Hoang
(74) *Attorney, Agent, or Firm* — Harness, Dickey & Pierce, P.L.C.

(57) ABSTRACT

Provided is a control signal generator for a sense amplifier, the control signal generator including a replica circuit including replica transistors corresponding to transistors included in the sense amplifier, and configured to receive at least one input signal of the sense amplifier and a first control signal for enabling a sensing operation by the sense amplifier; and an amplifying circuit configured to output, by amplifying an output signal from the replica circuit, a second control signal for enabling an amplifying operation by the sense amplifier after the sensing operation is enabled.

20 Claims, 16 Drawing Sheets

(56) References Cited

U.S. PATENT DOCUMENTS

| | | | |
|---|---|---|---|
| 2015/0003146 A1* | 1/2015 | Chun | G11C 11/4094 |
| | | | 365/149 |
| 2015/0187394 A1 | 7/2015 | Lee et al. | |
| 2015/0279448 A1 | 10/2015 | Thewes | |
| 2016/0086652 A1* | 3/2016 | Thewes | G11C 7/04 |
| | | | 365/149 |
| 2017/0178742 A1* | 6/2017 | Qiu | G11C 17/18 |
| 2019/0066778 A1* | 2/2019 | Lin | G11C 13/0028 |

\* cited by examiner

US 10,777,255 B2

CONTROL SIGNAL GENERATOR FOR SENSE AMPLIFIER AND MEMORY DEVICE INCLUDING THE CONTROL SIGNAL GENERATOR

CROSS-REFERENCE TO RELATED APPLICATIONS

This application claims the benefit of Korean Patent Application Nos. 10-2018-0031714, filed on Mar. 19, 2018, and 10-2018-0111021, filed on Sep. 17, 2018 in the Korean Intellectual Property Office, the disclosures of which are incorporated herein in their entirety by reference.

BACKGROUND

The inventive concepts relate to control of a sense amplifier, and more particularly, to a control signal generator for a sense amplifier and a memory device including the control signal generator.

A memory device may include a memory cell having different states depending on stored data, and may output data stored in the memory cell by detecting a state of the memory cell, in response to a read command. To detect the state of the memory cell, the memory device may include a sense amplifier to sense and amplify a signal, e.g., a voltage and/or a current, which is provided via a bit line connected to the memory cell. An operation of the sense amplifier may be controlled by a control signal, and when the control signal is accurately generated, an error operation of the sense amplifier is reduced or prevented such that reliability of a read operation may be maintained.

SUMMARY

The inventive concepts relate to control of a sense amplifier and provide a control signal generator capable of accurately controlling a sense amplifier by using a replica circuit of the sense amplifier, and a memory device including the control signal generator.

According to an aspect of the inventive concepts, there is provided a control signal generator for a sense amplifier, the control signal generator including a replica circuit including replica transistors corresponding to transistors included in the sense amplifier, and configured to receive at least one input signal of the sense amplifier and a first control signal for enabling a sensing operation by the sense amplifier; and an amplifying circuit configured to output, by amplifying an output signal from the replica circuit, a second control signal for enabling an amplifying operation by the sense amplifier after the sensing operation is enabled.

According to another aspect of the inventive concepts, there is provided a control signal generator for a sense amplifier, the control signal generator including a replica circuit including replica transistors corresponding to transistors included in the sense amplifier, and configured to generate an output signal for emulating an output from the sense amplifier, in response to a first control signal for enabling a sensing operation by the sense amplifier; and an amplifying circuit configured to output, by amplifying the output signal from the replica circuit, a second control signal for enabling an amplifying operation by the sense amplifier after the sensing operation is enabled.

According to another aspect of the inventive concepts, there is provided a memory device including a memory cell; a sense amplifier configured to sense and amplify a data input signal that varies according to data stored in the memory cell; a controller configured to generate a first control signal for enabling a sensing operation by the sense amplifier; and a control signal generator configured to generate, from the first control signal, a second control signal for enabling an amplifying operation by the sense amplifier, wherein the control signal generator includes a replica circuit corresponding to the sense amplifier, and an amplifying circuit configured to generate the second control signal by amplifying an output signal from the replica circuit.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
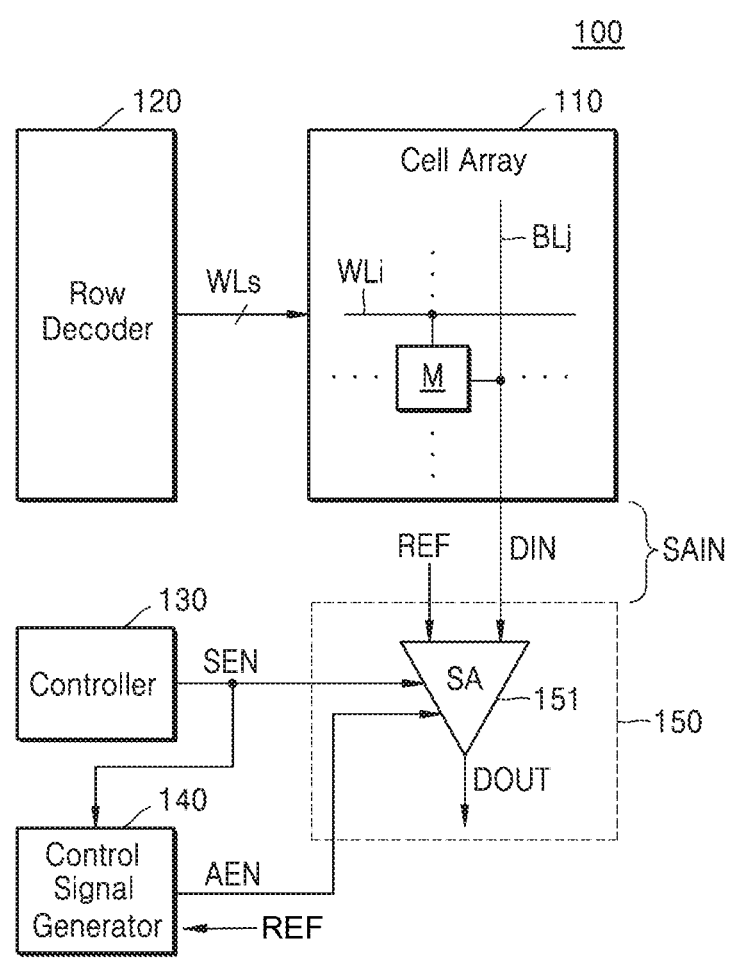
FIG. 1 is a block diagram illustrating a memory device according to an example embodiment.

FIG. 1 is a block diagram illustrating a memory device 100 according to an example embodiment. For example, FIG. 1 illustrates components included in the memory device 100, the components including a cell array 110 in a read operation, a row decoder 120, a controller 130, a control signal generator 140, and/or a read circuit 150.

The memory device 100 may receive a command and an address from an external source, and may receive or output data. For example, the memory device 100 may receive a command such as a write command, a read command, or the like, and an address corresponding to the command. The memory device 100 may receive data in response to a write command, and may output data in response to a read command. In some example embodiments, the command, the address, and data may be received or transmitted via independent channels, and in some example embodiments, at least two of the command, the address, and data may be received or transmitted via a same channel.

The cell array 110 may include a memory cell M, and the memory cell M may be connected to a word line WLi and a bit line BLj. The memory cell M is an element capable of storing data, and may have a state corresponding to stored data. In some example embodiments, the memory cell M may include a variable resistance element as will be described below with reference to FIG. 11, and the variable resistance element may have resistance corresponding to the data stored in the memory cell M. In some example embodiments, the memory cell M, such as dynamic random access memory (DRAM), may include a capacitor, and the capacitor may have charges corresponding to the data stored in the memory cell M. In some example embodiments, the memory cell M, such as a flash memory, may include a floating gate transistor, and the floating gate transistor may have a threshold voltage corresponding to the data stored in the memory cell M.

The memory cell M may be selected by the word line WLi and may provide, via the bit line BLj, a signal corresponding to the state of the memory cell M. For example, memory cells included in a same row in the cell array 110 may share one word line, and memory cells included in a same column may share one bit line. In some example embodiments, when the memory cell M includes the variable resistance element, the memory cell M selected by the activated word line WLi may provide a read voltage, in response to a read current. In some example embodiments, when the memory cell M includes the capacitor, the memory cell M selected by the activated word line WLi may provide a read voltage by providing charges to the bit line BLj or withdrawing charges from the bit line BLj. In some example embodiments, when the memory cell M includes the floating gate transistor, the memory cell M selected by the activated word line WLi may provide a read voltage by transferring, to the bit line BLj, a voltage received from a source line or blocking the voltage. Throughout the specification, as illustrated in FIG. 1, a signal that is provided from the memory cell M via the bit line BLj in a read operation may also be referred to as a data input signal DIN.

The row decoder 120 may activate one of a plurality of word lines WLs according to an address received with a read command or a write command, and memory cells connected to the activated word line may be selected. For example, the row decoder 120 may activate one (e.g., the word line WLi) of the plurality of word lines WLs according to an address (or a row address), e.g., may activate the plurality of word lines WLs in a mutually exclusive manner. Accordingly, memory cells included in one row from among memory cells included in the cell array 110 may be selected.

The read circuit 150 may be connected to the cell array 110 via bit lines, and may determine data stored in memory cells of the cell array 110 in response to signals received via the bit lines. For example, as illustrated in FIG. 1, the read circuit 150 may include a sense amplifier 151, and the sense amplifier 151 may receive the data input signal DIN via the bit line BLj. Also, the sense amplifier 151 may receive a reference signal REF, and may determine data corresponding to the data input signal DIN, based on the reference signal REF, thereby generating a data output signal DOUT. As illustrated in FIG. 1, throughout the specification, the data input signal DIN and the reference signal REF, which are provided to the sense amplifier 151, may be collectively referred to as an input signal SAIN of the sense amplifier 151. In some example embodiments, when the memory cell M stores data of at least two bits, the sense amplifier 151 may process the data input signal DIN at least twice by using the reference signal REF having at least two different levels. In some example embodiments, the read circuit 150 may include a register such as a latch, a flip-flop, or the like which stores data, and the register may receive the data output signal DOUT and may temporarily store data. Although FIG. 1 illustrates only the read circuit 150, the memory device 100 may further include a write circuit to provide a write signal for writing data to the memory cell M, and in some example embodiments, the memory device 100 may include a write/read circuit in which the write circuit and the read circuit 150 are implemented as one block.

The sense amplifier 151 may sequentially perform a plurality of operations to process the reference signal REF and the data input signal DIN. For example, as will be described below with reference to FIG. 2, the sense amplifier 151 may stand by until the data input signal DIN is developed at the bit line BLj, and after the data input signal DIN is developed at the bit line BLj, the sense amplifier 151 may start an operation of sensing the data input signal DIN (e.g., a sensing operation). A difference between states of the memory cell M depending on stored data, and a difference between levels of the data input signal DIN corresponding to the states may not be great according to a size of the memory cell M, power consumption of the memory cell M, or the like. Accordingly, the sense amplifier 151 may pre-perform the operation of sensing the data input signal DIN, and in some example embodiments, the sensing operation may also be referred to as a pre-sensing operation or a pre-charging operation. Afterward, the sense amplifier 151 may perform an operation of generating the data output signal DOUT (e.g., an amplifying operation) by amplifying a sensing result of the sensing operation. As described above, the data output signal DOUT may be provided to the register, and according to the amplifying operation of the sense amplifier 151, the data output signal DOUT may have a level to be recognized by the register. In some example embodiments, the amplifying operation may also be referred to as a post-sensing operation or a latching operation.

The sense amplifier 151 of the memory device 100 may be requested to separately perform each of a plurality of operations at appropriate time points. For example, when some operation periods of the sense amplifier 151 are decreased, an error may occur in a read operation, and on the other hand, when some operation periods of the sense amplifier 151 are increased, power consumption may be increased and/or a read speed of the memory device 100 may be decreased. The sense amplifier 151 may start or end each of the plurality of operations, in response to at least one control signal, and accordingly, a control signal to be provided to the sense amplifier 151 may be generated to allow the plurality of operations to be appropriately performed by the sense amplifier 151. For example, as illustrated in FIG. 1, the sense amplifier 151 may receive a sensing enable signal SEN for controlling the sensing operation, and an amplification enable signal AEN for controlling the amplifying operation. Throughout the specification, the sensing enable signal SEN may also be referred to as a first control signal, and the amplification enable signal AEN may also be referred to as a second control signal.

The controller 130 may control components included in the memory device 100 according to a command received by the memory device 100. The controller 130 may generate the sensing enable signal SEN, and in response to a read command, may provide the activated sensing enable signal SEN to the sense amplifier 151. The sense amplifier 151 may perform the sensing operation, in response to the activated sensing enable signal SEN.

The control signal generator 140 may receive the sensing enable signal SEN from the controller 130, and may generate the amplification enable signal AEN. In some example embodiments, the control signal generator 140 may provide the activated amplification enable signal AEN to the sense amplifier 151, in response to the activated sensing enable signal SEN, so as to allow the sense amplifier 151 to perform the amplifying operation after performing the sensing operation during an appropriate period. As will be described below with reference to FIG. 2, a period in which the sense amplifier 151 performs the sensing operation may be equal to or less than several ns (e.g., about 2 ns), and it may not be easy to generate the amplification enable signal AEN from the sensing enable signal SEN via a delay counted using a clock signal or the like.

Hereinafter, as will be described below with reference to the drawings, the control signal generator 140 may activate the amplification enable signal AEN at an appropriate timing by emulating the sense amplifier 151. For example, the control signal generator 140 may include a replica circuit (e.g., a replica circuit 141 of FIG. 4) obtained by replicating at least some portions of the sense amplifier 151, and may generate the amplification enable signal AEN, based on an output signal from the replica circuit. Accordingly, the amplification enable signal AEN may be activated based on a state of the sense amplifier 151 according to the activated sensing enable signal SEN. Also, the amplification enable signal AEN may be activated at an accurate timing since the sense amplifier 151 and the replica circuit may experience same variations in a process, a voltage, temperature, or the like, such that an error in a read operation may be reduced or prevented. Also, a margin included in a read time may be deleted to compensate for the variations in a process, a voltage, temperature, or the like, such that the read time may be decreased. Also, a component to compensate for the variations in a process, a voltage, temperature, or the like may be excluded from the memory device 100, and an operation of correcting timing of the amplification enable signal AEN may be skipped in the manufacturing process of the memory device 100.

Figure 2:
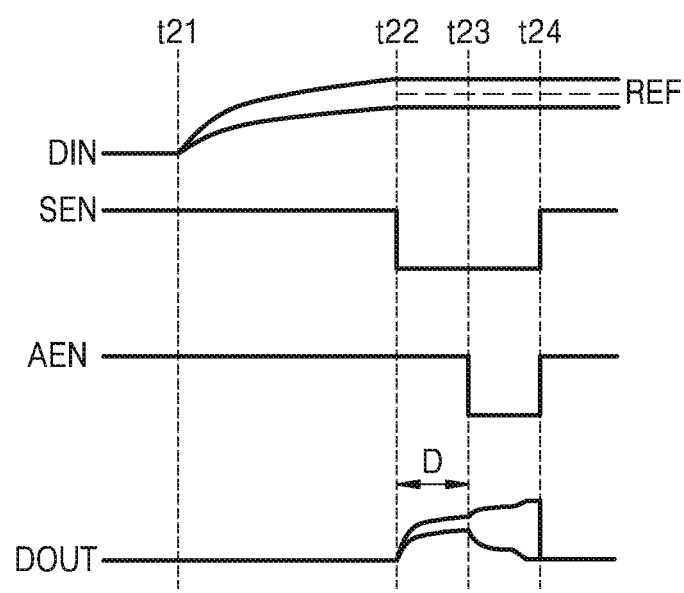
FIG. 2 is a timing diagram illustrating signals in a read operation of the memory device, according to an example embodiment.

FIG. 2 is a timing diagram illustrating signals in a read operation of the memory device 100, according to an example embodiment. For example, FIG. 2 illustrates the data input signal DIN, the reference signal REF, the sensing enable signal SEN, and the amplification enable signal AEN, which are provided to the sense amplifier 151 of the memory device 100 of FIG. 1 according to times, and illustrates the data output signal DOUT generated by the sense amplifier 151. Throughout the specification, the sensing enable signal SEN and the amplification enable signal AEN may be active high signals. Hereinafter, FIG. 2 will now be described with reference to FIG. 1.

Referring to FIG. 2, development of the data input signal DIN may start at time t21. For example, at time t21, the bit line BLj may be electrically connected to the read circuit 150 according to a read command. Between time t21 and time t22, a level of the data input signal DIN may be gradually shifted toward a level corresponding to a state of the memory cell M, and a period (e.g., between time t21 and time t22) in which a level of the data input signal DIN is shifted may also be referred to as a development period. As illustrated in FIG. 2, in the development period, a level of the data input signal DIN may relatively sharply rise or may relatively gently rise, according to data stored in the memory cell M. Although FIG. 2 illustrates an example in which the data input signal DIN gradually rises in the development period, in some example embodiments, the data input signal DIN may gradually fall. Between time t21 and time t22, e.g., in the development period, the sensing enable signal SEN and the amplification enable signal AEN may remain in an inactivated state.

The sensing enable signal SEN may be activated at time t22. As illustrated in FIG. 2, when the development period is ended, the data input signal DIN may have a level higher or lower than a level of the reference signal REF. The controller 130 may activate the sensing enable signal SEN after a time period corresponding to the development period is passed from time t21. In response to the activated sensing enable signal SEN, the sense amplifier 151 may perform the sensing operation, and as illustrated in FIG. 2, a level of the data output signal DOUT may be changed. In some example embodiments, when a level of the data input signal DIN is higher than a level of the reference signal REF at time t22, the level of the data output signal DOUT may relatively sharply rise, and whereas, when the level of the data input signal DIN is lower than the level of the reference signal REF at time t22, the level of the data output signal DOUT may relatively gently rise. On the other hand, in some example embodiments, when the level of the data input signal DIN is lower than the level of the reference signal REF at time t22, the level of the data output signal DOUT may relatively sharply rise, and whereas, when the level of the data input signal DIN is higher than the level of the reference signal REF at time t22, the level of the data output signal DOUT may relatively gently rise.

The amplification enable signal AEN may be activated at time t23. As illustrated in FIG. 2, the data output signal DOUT may have different levels according to levels of the data input signal DIN at time t23. The control signal generator 140 may generate the amplification enable signal AEN at time t23, and the sense amplifier 151 may perform the amplifying operation in response to the activated amplification enable signal AEN. Accordingly, as illustrated in FIG. 2, between time t23 and time t24, a level of the data output signal DOUT may be gradually shifted toward a high level or may be gradually shifted toward a low level. As described above with reference to FIG. 1, the control signal generator 140 may generate the amplification enable signal AEN by emulating the sense amplifier 151, such that an optimized period D in which an error in a read operation is reduced or prevented and power consumption and a read time are decreased may be provided.

The sensing enable signal SEN and the amplification enable signal AEN may be inactivated at time t24. As illustrated in FIG. 2, before time t24, the data output signal DOUT may have a high level or a low level according to the amplifying operation of the sense amplifier 151, and data according to a level of the data output signal DOUT may be stored in the register. Afterward, at timing t24, the data output signal DOUT may have a level equal to that before time t22, according to the inactivated sensing enable signal SEN and the inactivated amplification enable signal AEN.

Figure 3:
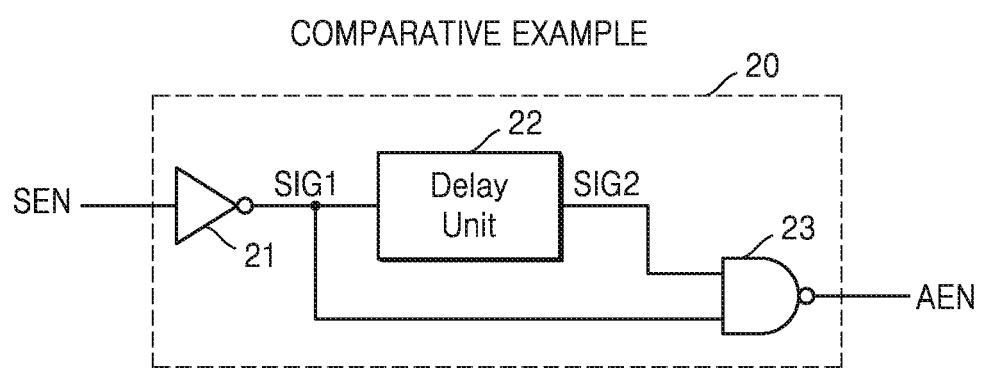
FIG. 3 is a block diagram of a signal generator generating an amplification enable signal from a sensing enable signal, according to a comparative example.

FIG. 3 is a block diagram of a signal generator 20 generating the amplification enable signal AEN from the sensing enable signal SEN, according to a comparative example. For example, FIG. 3 illustrates an example in which the amplification enable signal AEN is generated from the sensing enable signal SEN by using a delay unit 22. As illustrated in FIG. 3, the signal generator 20 may include an inverter 21, the delay unit 22, and/or a NAND gate 23.

As described above with reference to FIG. 2, the delay unit 22 may be used to generate the activated amplification enable signal AEN after the sensing enable signal SEN is activated and then a period D is passed. The delay unit 22 may generate a second signal SIG2 by delaying a first signal SIG1 output from the inverter 21. Accordingly, the amplification enable signal AEN may be generated, via the NAND gate 23, from the first signal SIG1 inverted from the activated sensing enable signal SEN and the second signal SIG2 obtained by delaying the first signal SIG1.

The delay unit 22 may include a passive element such as a resistor, a capacitor, a diode, or the like, and/or an active element such as a transistor. A delay provided by the passive element unit 22 according to characteristics of the passive element and/or the active element included in the delay unit 22 may vary according to a process, a voltage, temperature, or the like, such that, when the amplification enable signal AEN is generated by the signal generator 20 of FIG. 3, the period D of FIG. 2 may be changed. For example, when a delay provided by the delay unit 22 is decreased due to a process, a voltage, temperature, or the like, the period D may be decreased, and at time t23, the data output signal DOUT may not rise to a level required for the amplifying operation of the sense amplifier 151. Accordingly, a level of the data output signal DOUT may be shifted to a low level after time t23, regardless of the data input signal DIN. On the other hand, when a delay provided by the delay unit 22 is increased due to a process, a voltage, temperature, or the like, the period D may be increased, and power consumption and a read time may be increased due to the sensing operation.

Figure 4:
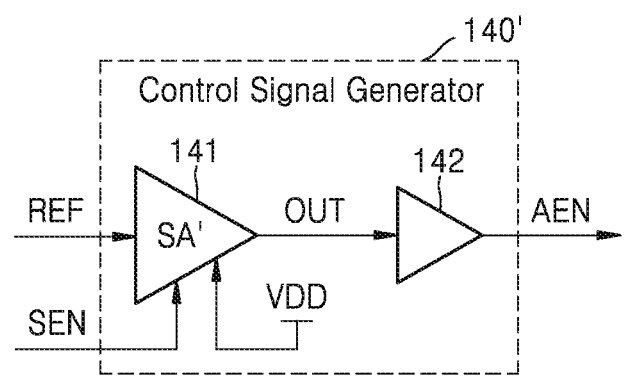
FIG. 4 is a block diagram illustrating an example of a control signal generator of FIG. 1, according to an example embodiment.

FIG. 4 is a block diagram illustrating an example of the control signal generator 140 of FIG. 1, according to an example embodiment. As described above with reference to FIG. 1, a control signal generator 140' of FIG. 4 may receive the sensing enable signal SEN, and may generate the amplification enable signal AEN. Hereinafter, FIG. 4 will now be described with reference to FIG. 1.

Referring to FIG. 4, the control signal generator 140' may include the replica circuit 141 of the sense amplifier 151, and an amplifying circuit 142. The replica circuit 141 may have a structure that is equal to at least some portions of the sense amplifier 151. In some example embodiments, the replica circuit 141 may include replica transistors that are equal to (or the same as) at least some transistors included in the sense amplifier 151. As illustrated in FIG. 4, the replica circuit 141 may receive commonly the reference signal REF and the sensing enable signal SEN of the sense amplifier 151, and may receive a signal equal to the inactivated amplification enable signal AEN, e.g., a positive supply voltage VDD as a signal of a high level. The replica circuit 141 may provide an output signal OUT to the amplifying circuit 142.

The amplifying circuit 142 may generate the amplification enable signal AEN by amplifying the output signal OUT of the replica circuit 141. In some example embodiments, the amplifying circuit 142 may be configured to amplify the output signal OUT of the replica circuit 141 when the output signal OUT of the replica circuit 141 corresponds to the data output signal DOUT of the sense amplifier 151, which provides a maximum gain in the amplifying operation of the sense amplifier 151. Accordingly, the amplification enable signal AEN may be activated at a time point when the maximum gain is available in the amplifying operation of the sense amplifier 151, and as a result, the control signal generator 140' may provide the optimized period D of FIG. 2. Examples of the control signal generator 140' will be described below with reference to FIGS. 6A, 6B, and 9.

Figure 5:
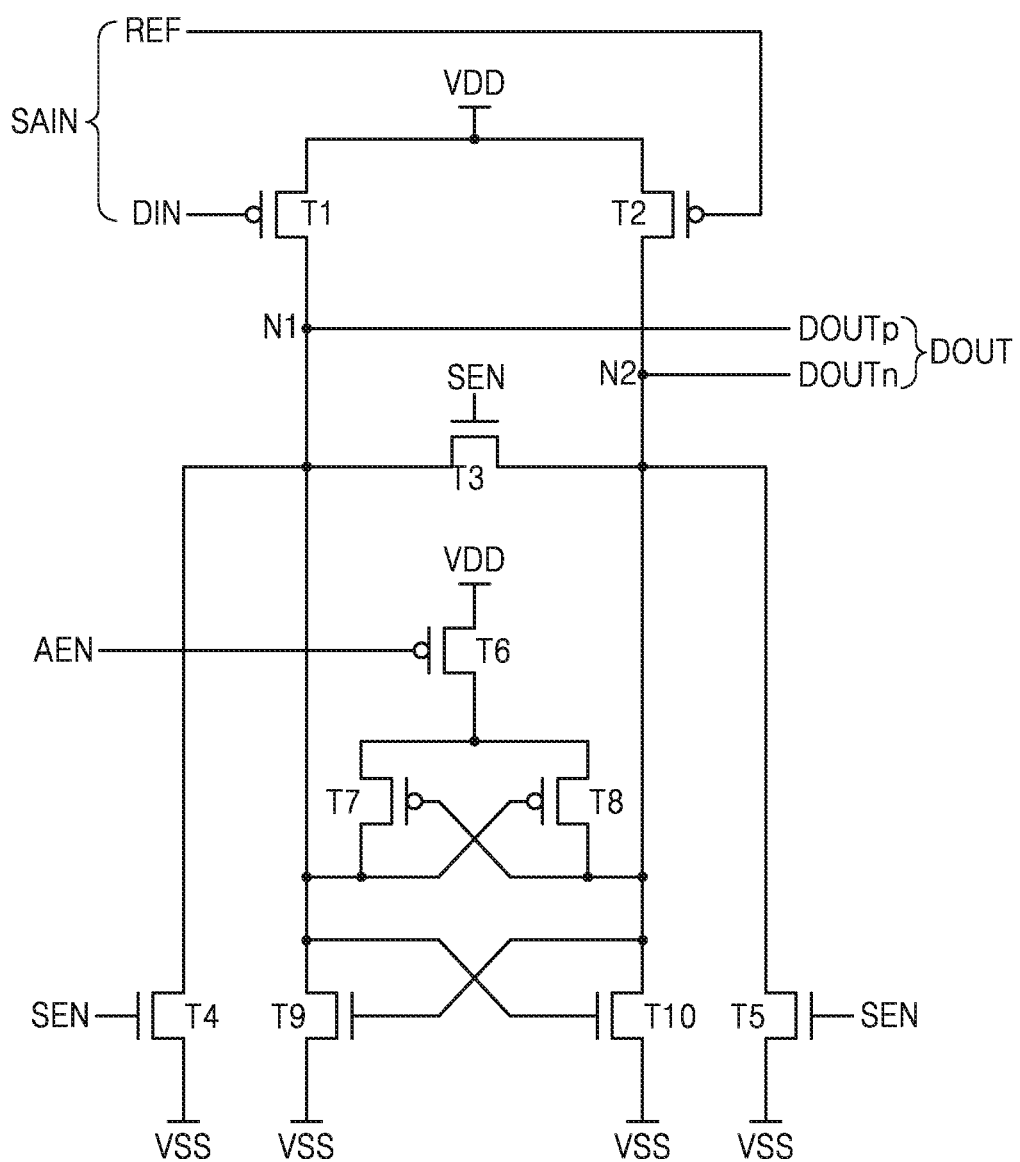
FIG. 5 is a circuit diagram illustrating an example of a sense amplifier of FIG. 1, according to an example embodiment.

FIG. 5 is a circuit diagram illustrating an example of the sense amplifier 151 of FIG. 1, according to an example embodiment. As described above with reference to FIG. 1, a sense amplifier 151' of FIG. 5 may receive the data input signal DIN and the reference signal REF as input signals SAIN, and may receive the sensing enable signal SEN and the amplification enable signal AEN as control signals. Also, the sense amplifier 151' may generate the data output signal DOUT including a positive signal DOUTp and a negative signal DOUTn, as a differential signal. As illustrated in FIG. 5, the sense amplifier 151' may include a plurality of transistors T1 to T10 (also referred to as the first through tenth transistors T1 to T10), and hereinafter, FIG. 5 will now be described with reference to FIGS. 1 and 2.

The first transistors T1 and the second transistor T2 are PMOS transistors and may each have a gate that receives the data input signal DIN and the reference signal REF. Also, the first transistors T1 and the second transistor T2 may each have a source to which a positive supply voltage VDD is applied, and may have respective drains that are connected to a first node N1 and a second node N2, respectively, that output the data output signal DOUT. Throughout the specification, the first transistors T1 and the second transistor T2 may also be referred to as input transistors, and may be collectively referred to as an input stage.

The third transistor T3 is an NMOS transistor, and may electrically connect the first node N1 to the second node N2, in response to the inactivated sensing enable signal SEN, e.g., the sensing enable signal SEN having a high level. Accordingly, the first node N1 and the second node N2 may have a same electric potential before the sensing operation is performed, e.g., before the sensing enable signal SEN is activated. Throughout the specification, the third transistor T3 may also be referred to as an equalization transistor. In some example embodiments, the equalization transistor may be excluded.

The fourth transistor T4 and the fifth transistor T5 are NMOS transistors, and may apply, as a constant electric potential, a negative supply voltage VSS to the first node N1 and the second node N2, in response to the inactivated sensing enable signal SEN, e.g., the sensing enable signal SEN having a high level. Accordingly, the first node N1 and the second node N2 may have the negative supply voltage VSS before the sensing operation is performed. Throughout the specification, the fourth transistor T4 and the fifth transistor T5 may also be referred to as reset transistors.

As illustrated in FIG. 5, the seventh to tenth transistors T7 to T10 may form a structure in which two inverters mutually connect input and output, and the two inverters mutually provide a positive feedback, thereby amplifying voltages of the first node N1 and the second node N2. Throughout the specification, the seventh to tenth transistors T7 to T10 may also be referred to as amplifying transistors. In some example embodiments, the two inverters may have a same current driving capacity. For example, the seventh transistor T7 and the ninth transistor T9, which configure a first inverter, may each have a same size (e.g., a channel width) as the eighth transistor T8 and the tenth transistor T10, which configure a second inverter.

The sixth transistor T6 may block the positive supply voltage VDD to the amplifying transistors, in response to the inactivated amplification enable signal AEN, e.g., the amplification enable signal AEN having a high level, and may provide the positive supply voltage VDD to the amplifying transistors, in response to the activated amplification enable signal AEN, e.g., the amplification enable signal AEN having a low level. Throughout the specification, the sixth transistor T6 may also be referred to as an amplification enable transistor.

Figure 6A:
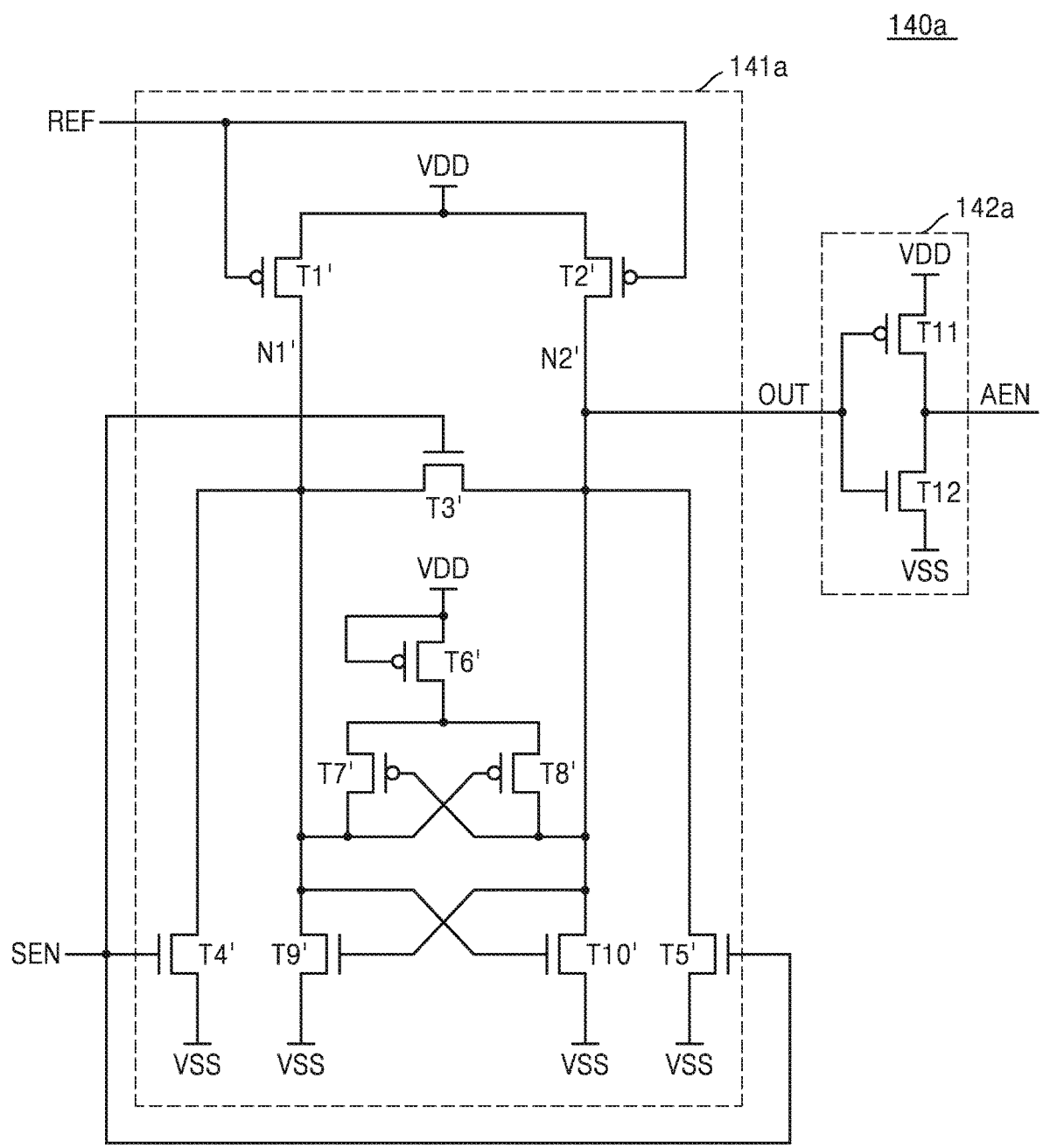
FIGS. 6A and 6B are circuit diagrams illustrating examples of a control signal generator of FIG. 4 according to example embodiments.
Figure 6B:
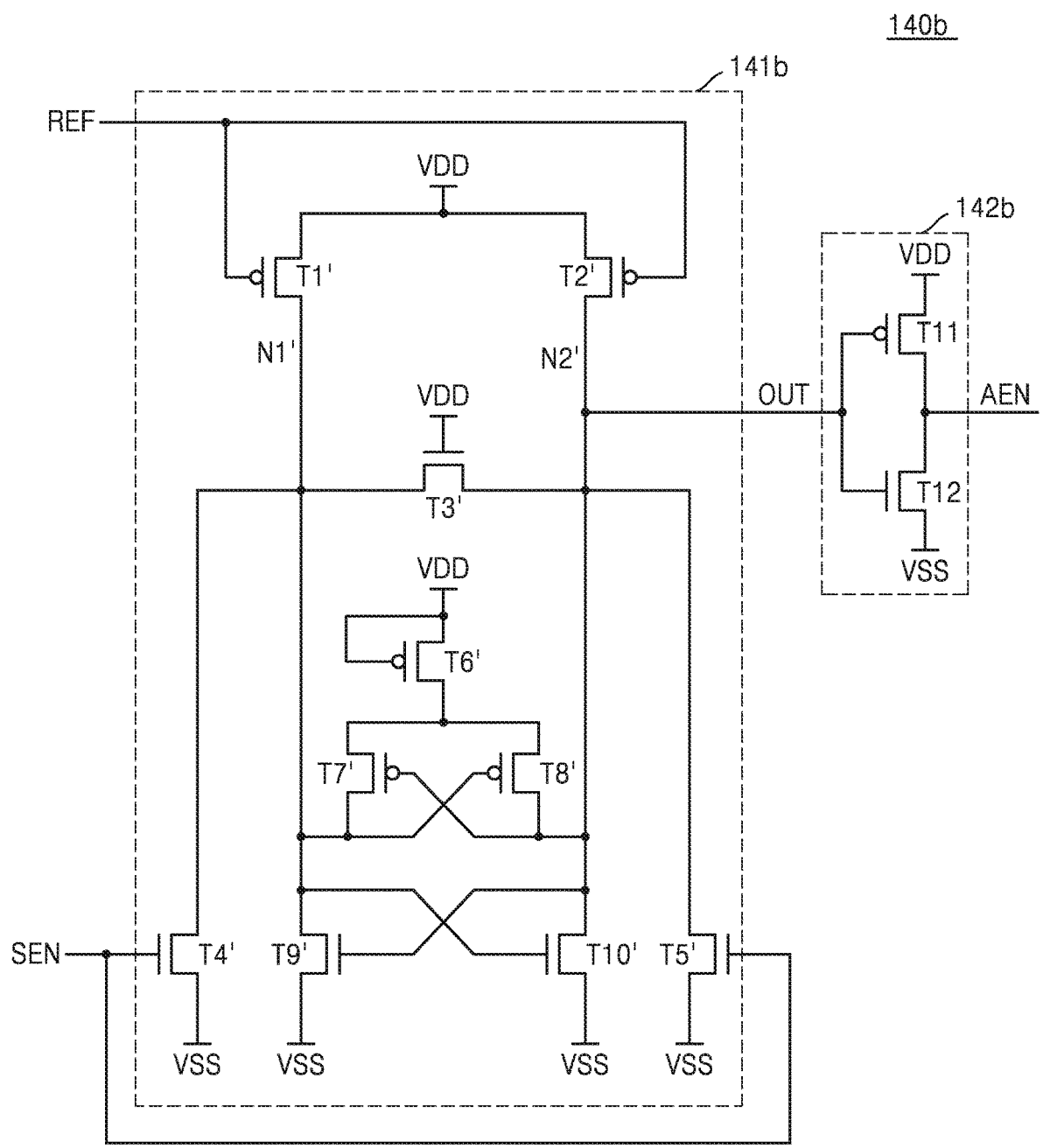

FIGS. 6A and 6B are circuit diagrams illustrating examples of the control signal generator 140' of FIG. 4 according to example embodiments. For example, the circuit diagrams of FIGS. 6A and 6B illustrate control signal generators 140a and 140b that respectively include replica circuits 141a and 141b corresponding to the sense amplifier 151' of FIG. 5. Hereinafter, FIGS. 6A and 6B will now be described with reference to FIG. 5, and descriptions that are redundant among FIGS. 5, 6A, and 6B are provided only once.

Referring to FIG. 6A, the control signal generator 140a may include the replica circuit 141a and an amplifying circuit 142a. The replica circuit 141a may include a plurality of replica transistors T1' to T10' corresponding to the plurality of transistors T1 to T10 of the sense amplifier 151'. The plurality of replica transistors T1' to T10' (also referred to as the first through tenth transistors T1' to T10') of the replica circuit 141a may have same sizes as the respective plurality of transistors T1 to T10 of the sense amplifier 151'.

As illustrated in FIG. 6A, compared to the sense amplifier 151' of FIG. 5, the first transistor T1' and the second transistor T2' that are input transistors of the replica circuit 141a may commonly receive the reference signal REF. Also, the sixth transistor T6' that is an amplification enable transistor of the replica circuit 141a may have a gate to which a positive supply voltage VDD corresponding to the inactivated amplification enable signal AEN is applied. Accordingly, as will be described below with reference to FIG. 7, a first node N1' and a second node N2' of the replica circuit 141a may have a same voltage as the second node N2 of the sense amplifier 151' when the sense amplifier 151' performs the amplifying operation.

The amplifying circuit 142a may function as an inverter that outputs the amplification enable signal AEN by inverting an output signal OUT of the replica circuit 141a. In some example embodiments, transistors T11 and T12 (also referred to as the eleventh and twelfth transistors T11 and T12) included in the amplifying circuit 142a may have same sizes as amplifying transistors of the replica circuit 141a (or the amplifying transistors of the sense amplifier 151'). For example, the eleventh transistor T11 of the amplifying circuit 142a, which is a PMOS transistor, may have a same size as the seventh transistor T7' (or the eighth transistor T8') of the replica circuit 141a, and the twelfth transistor T12 of the amplifying circuit 142a, which is an NMOS transistor, may have a same size as the ninth transistor T9' (or the tenth transistor T10') of the replica circuit 141a. Accordingly, the amplifying circuit 142a may start the amplifying operation according to a level of an output signal OUT of the replica circuit 141a, and in response to the amplification enable signal AEN that is activated according to the amplifying operation of the amplifying circuit 142a, the amplifying transistors of the sense amplifier 151' may start the amplifying operation.

Referring to FIG. 6B, the control signal generator 140b may include the replica circuit 141b and an amplifying circuit 142b. Compared to the control signal generator 140a of FIG. 6A, the replica circuit 141b in the control signal generator 140b of FIG. 6B may include an equalization transistor that is always turned on. For example, as illustrated in FIG. 6B, as the equalization transistor, the third transistor T3' of the replica circuit 141b may have a gate to which a positive supply voltage VDD corresponding to the inactivated sensing enable signal SEN is applied. Accordingly, the first node N1' and the second node N1' may have a same electric potential.

Figure 7:
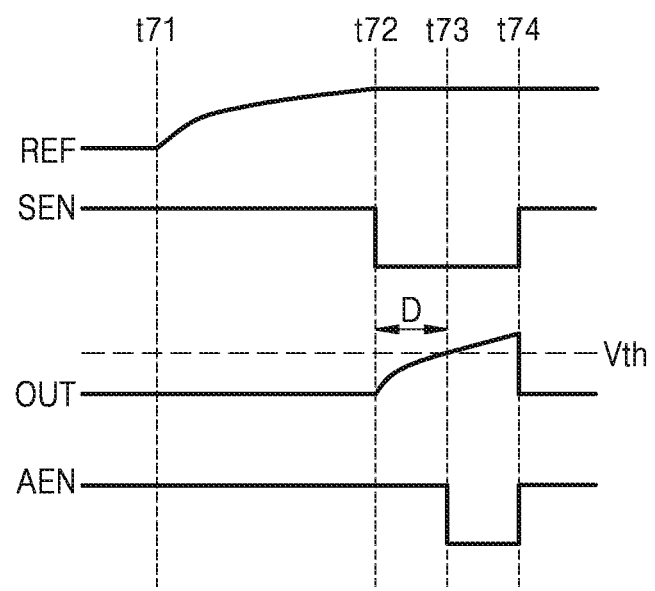
FIG. 7 is a timing diagram illustrating operations of control signal generators of FIGS. 6A and 6B, according to an example embodiment.

FIG. 7 is a timing diagram illustrating operations of the control signal generators 140a and 140b of FIGS. 6A and 6B, according to an example embodiment. Hereinafter, FIG. 7 will now be described with reference to FIGS. 5 and 6B, and descriptions that are redundant with respect to descriptions of FIG. 2 are not provided here.

Referring to FIG. 7, development of the reference signal REF may start at time t71. In some example embodiments, as will be described below with reference to FIG. 12, the reference signal REF may have a level that is shifted in a development period (e.g., between time t71 and time t72) in a similar manner to the data input signal DIN. On the other hand, in some example embodiments, in a different manner to what is illustrated in FIG. 5, the reference signal REF may have a constant level, e.g., a level equal to a level after time t72, while the data input signal DIN is being developed.

The sensing enable signal SEN may be enabled at time t72, such that a level of an output signal OUT of the replica circuit 141b may rise. As described above with reference to FIGS. 6A and 6B, the level of the output signal OUT may be shifted in a materially same manner as a level of the second node N2 of the sense amplifier 151'.

At time t73, the level of the output signal OUT may cross a threshold voltage Vth of the twelfth transistor T12 that is an NMOS transistor, and thus the twelfth transistor T12 is turned on such that the amplification enable signal AEN may transition to a low level. The twelfth transistor T12 may have a same size as the ninth transistor T9 and the tenth transistor T10 of the sense amplifier 151', and thus, the threshold voltage Vth of the twelfth transistor T12 may be equal to a threshold voltage of the ninth transistor T9 and the tenth transistor T10 of the sense amplifier 151'. A level of an output signal OUT of the replica circuit 141b is equal to the level of the second node N2 of the sense amplifier 151', and thus, the ninth transistor T9 and the tenth transistor T10 of the sense amplifier 151' may be turned on at time t73, and the sense amplifier 151' may start the amplifying operation in response to the activated amplification enable signal AEN. Accordingly, the amplifying operation by the amplifying transistors of the sense amplifier 15F may be performed at a time point when a maximum gain is provided, and as a result, an optimized period D may be provided by the control signal generator 140b.

At time t74, the sensing enable signal SEN may be inactivated, such that the first node N1' and the second node NT of the replica circuit 141a may have levels corresponding to a negative supply voltage VSS, and the output signal OUT may also have a low level. In response to the output signal OUT having a low level, the amplifying circuit 142b may output the inactivated amplification enable signal AEN.

Figure 8:
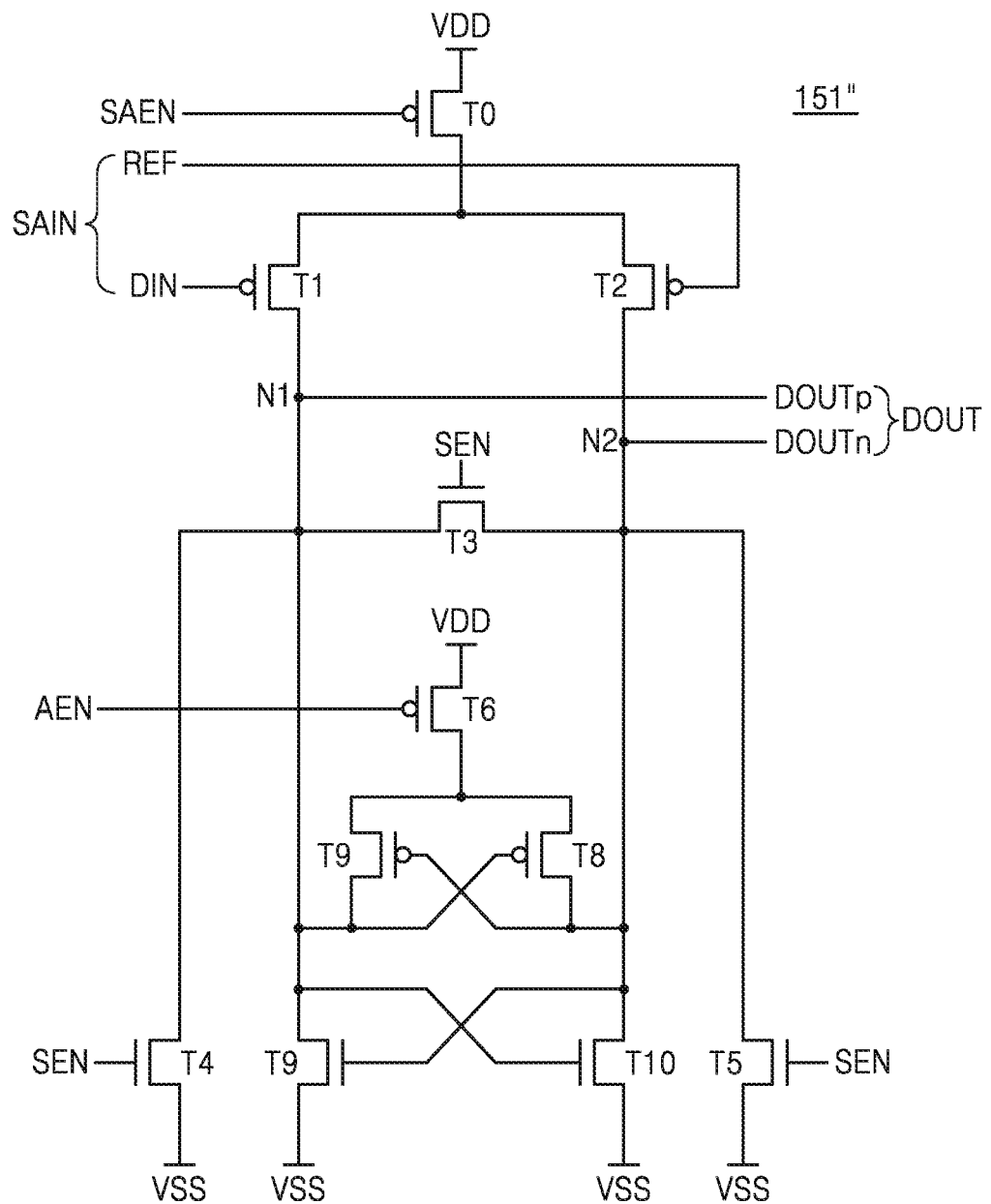
FIG. 8 is a circuit diagram illustrating an example of the sense amplifier of FIG. 1 according to an example embodiment.

FIG. 8 is a circuit diagram illustrating an example of the sense amplifier 151 of FIG. 1 according to an example embodiment. Compared to the sense amplifier 151' of FIG. 5, a sense amplifier 151" of FIG. 8 may further receive an input enable signal SAEN. Hereinafter, descriptions of FIG. 8 which are redundant with respect to descriptions of FIG. 5 are not provided here.

Referring to FIG. 8, the sense amplifier 151" may include first to tenth transistors T1 to T10 similar to those of the sense amplifier 151' of FIG. 5, and may further include an input enable transistor T0 having a gate to which the input enable signal SAEN is applied. In some example embodiments, the controller 130 of FIG. 1 may generate the input enable signal SAEN, and the input enable signal SAEN may set the memory device 100 to perform a read operation. For example, referring to FIG. 1, in response to the activated input enable signal SAEN, the bit line BLj may be electrically connected to the read circuit 150 and a signal for reading data stored in the memory cell M may be applied to the read circuit 150. Throughout the specification, the input enable signal SAEN may also be referred to as a third control signal.

As illustrated in FIG. 8, the input enable transistor T0 may block a positive supply voltage VDD to the first transistor T1 and the second transistor T2 that are the input transistors, in response to the inactivated input enable signal SAEN, e.g., the input enable signal SAEN having a high level, and may provide a positive supply voltage VDD to the first transistor T1 and the second transistor T2, in response to the activated input enable signal SAEN. Accordingly, power consumption by the first transistor T1 and the second transistor T2 in a period in which a read operation is not performed may not occur.

Figure 9:
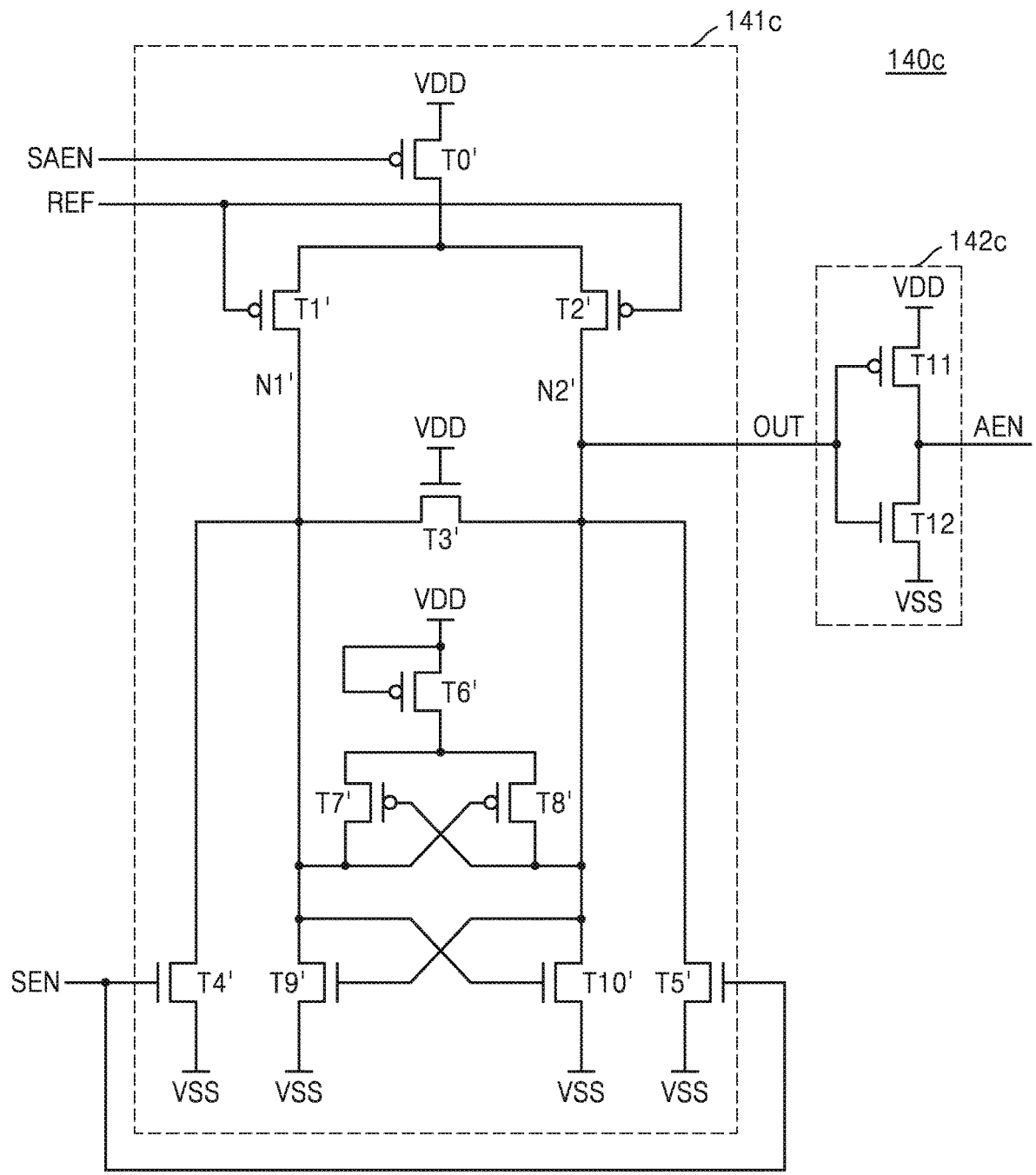
FIG. 9 is a circuit diagram illustrating an example of the control signal generator of FIG. 4, according to an example embodiment.

FIG. 9 is a circuit diagram illustrating an example of the control signal generator 140' of FIG. 4, according to an example embodiment. For example, the circuit diagram of FIG. 9 illustrates a control signal generator 140c that includes a replica circuit 141c corresponding to the sense amplifier 151" of FIG. 8. Hereinafter, descriptions of FIG. 9 which are redundant with respect to descriptions of FIGS. 6A, 6B, and 8 are not provided here.

Referring to FIG. 9, the control signal generator 140c may include the replica circuit 141c and an amplifying circuit 142c. The replica circuit 141c may include first to tenth transistors T1' to T10' similar to those of the replica circuit 141b of the control signal generator 140b of FIG. 6B, and may further include a replica transistor T0' corresponding to the input enable transistor T0 of the sense amplifier 151" of FIG. 8.

Figure 10:
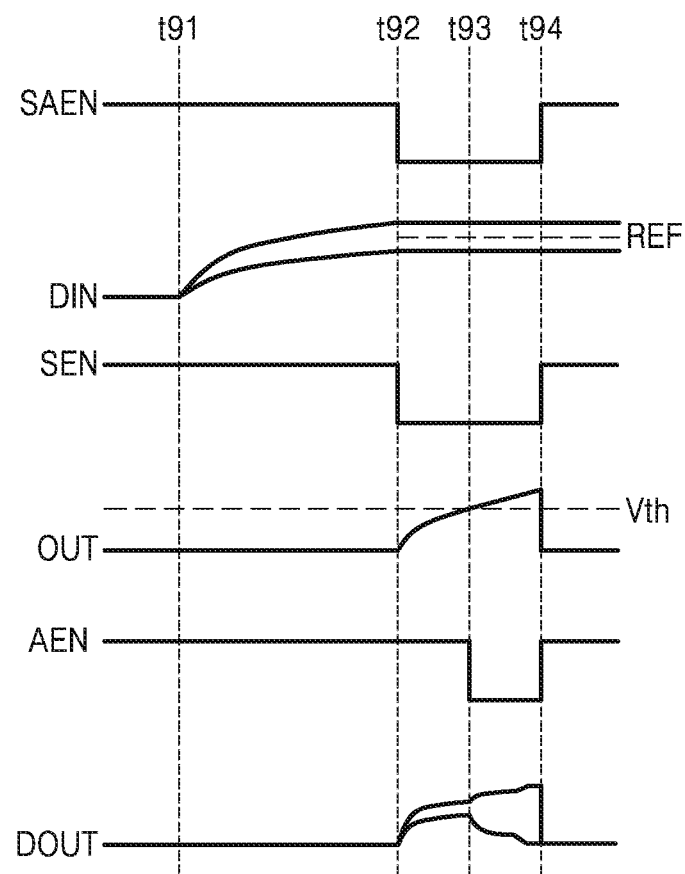
FIG. 10 is a timing diagram illustrating operations of a sense amplifier of FIG. 8 and a control signal generator of FIG. 9, according to an example embodiment.

FIG. 10 is a timing diagram illustrating operations of the sense amplifier 151" of FIG. 8 and the control signal generator 140c of FIG. 9, according to an example embodiment. Hereinafter, FIG. 10 will now be described with reference to FIGS. 8 and 9, and descriptions of FIG. 10 which are redundant with respect to descriptions of FIGS. 2 and 7 are not provided here.

Referring to FIG. 10, at time t91, the input enable signal SAEN may be activated. Accordingly, a development period may start, and development of the data input signal DIN may start. Before time t91, power consumption by the input transistors of the sense amplifier 151" and the replica circuit 141c may not occur, in response to the inactivated input enable signal SAEN.

At time t92, the sensing enable signal SEN may be activated, and a level of an output signal OUT of the replica circuit 141c and a level of a data output signal DOUT of the sense amplifier 151" may be shifted. At time t93, the level of the output signal OUT of the replica circuit 141c may cross a threshold voltage Vth of a transistor (e.g., the twelfth transistor T12 of FIG. 9) of the amplifying circuit 142c, such that the amplification enable signal AEN may be activated.

In response to the activated amplification enable signal AEN, the sense amplifier 151" may perform the amplifying operation, and the level of the data output signal DOUT may be shifted toward a high level or a low level. At time t94, the input enable signal SAEN and the sensing enable signal SEN may be inactivated. Accordingly, the output signal OUT of the replica circuit 141c may have a low level, and the amplification enable signal AEN may be inactivated.

Figure 11:
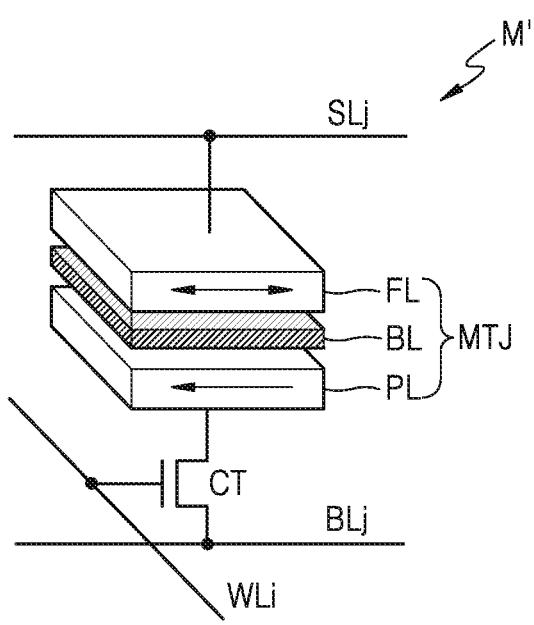
FIG. 11 is a diagram illustrating an example of a memory cell of FIG. 1, according to an example embodiment.
Figure 12:
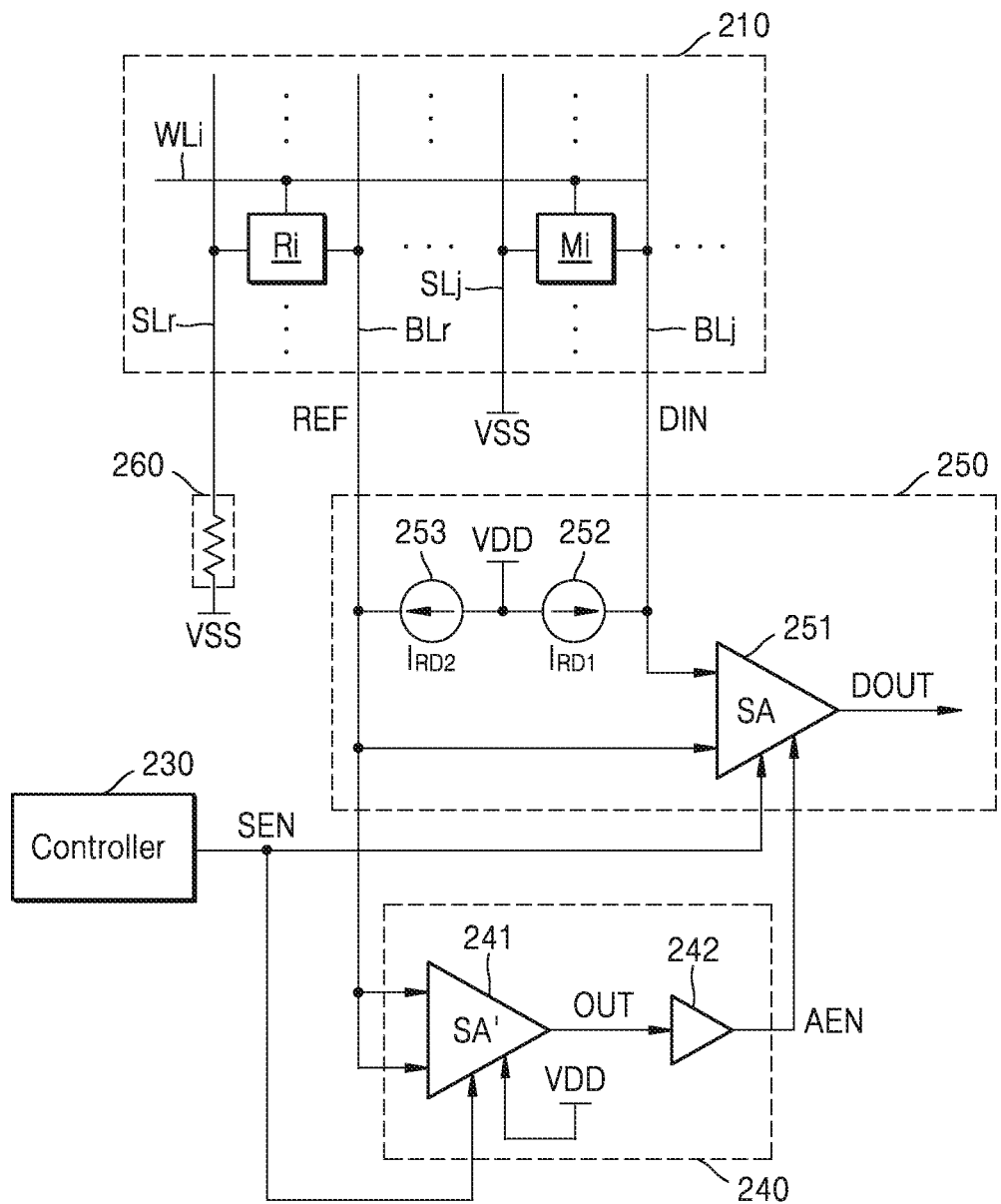
FIG. 12 is a block diagram illustrating a memory device including a memory cell of FIG. 11, according to an example embodiment.

FIG. 11 is a diagram illustrating an example of the memory cell M of FIG. 1, according to an example embodiment. FIG. 12 is a block diagram illustrating a memory device 200 including a memory cell M' of FIG. 11, according to an example embodiment. For example, FIG. 11 illustrates the memory cell M' including a magnetic tunnel junction (MTJ) as a variable resistance element, and FIG. 12 illustrates some components of the memory device 200 during a read operation.

Referring to FIG. 11, the memory cell M' may include the variable resistance element MTJ and a cell transistor CT, which are serially connected between a source line SLj and a bit line BLj. In some example embodiments, as illustrated in FIG. 11, the variable resistance element MTJ and the cell transistor CT may be sequentially connected between the source line SLj and the bit line BLj. In some example embodiments, unlike the illustration in FIG. 11, the cell transistor CT and the variable resistance element MTJ may be sequentially connected between the source line SLj and the bit line BLj.

The variable resistance element MTJ may include a free layer FL and a pinned layer PL, and may further include a barrier layer between the free layer FL and the pinned layer PL. As illustrated in FIG. 11 by using arrows, a magnetization direction of the pinned layer PL may be fixed, whereas a magnetization direction of the free layer FL may be equal to or inverse to the magnetization direction of the pinned layer PL. When the pinned layer PL and the free layer FL have the magnetization directions in one direction, the variable resistance element MTJ may be referred to being in a parallel state P, and when the pinned layer PL and the free layer FL have the magnetization directions in inverse directions, the variable resistance element MTJ may be referred to being in an anti-parallel state AP. In some example embodiments, the variable resistance element MTJ may further include an anti-ferromagnetic layer so as to allow the pinned layer PL to have a fixed magnetization direction. The variable resistance element MTJ may have relatively low resistance $R_P$ in the parallel state P and may have relatively high resistance $R_{AP}$ in the anti-parallel state AP. Throughout the specification, it is assumed that, when the variable resistance element MTJ in the parallel state P has low resistance $R_P$, the memory cell M' stores 0, and when the variable resistance element MTJ in the anti-parallel state AP has high resistance $R_{AP}$, the memory cell M' stores 1.

The cell transistor CT may have a gate (or a control terminal) connected to a word line WLi, and a source and a drain connected to the bit line BLj and the variable resistance element MTJ. The cell transistor CT may electrically connect or disconnect the variable resistance element MTJ and the bit line BLj, according to a voltage applied to the word line WLi. For example, in a write operation, to write 0 to the memory cell M', the activated word line WLi may have a positive supply voltage VDD, such that the cell transistor CT may be turned on and a current flowing from the source line SLj to the bit line BLj may pass through the variable resistance element MTJ via the cell transistor CT. Also, to write 1 to the memory cell M', the activated word line WLi may have a positive supply voltage VDD, such that the cell transistor CT may be turned on and a current flowing from the bit line BLj to the source line SLj may pass through the variable resistance element MTJ via the cell transistor CT. In the read operation, the cell transistor CT may be turned on, and the current flowing from the source line SLj to the bit line BLj or the current flowing from the bit line BLj to the source line SLj, e.g., a read current, may pass through the cell transistor CT and the variable resistance element MTJ. Throughout the specification, it is assumed that the read current flows from the bit line BLj to the source line SLj.

Referring to FIG. 12, the memory device 200 may include a cell array 210, a controller 230, a control signal generator 240, a read circuit 250, and/or a reference resistor 260. As described above with reference to FIG. 11, the cell array 210 may include a memory cell Mi including a variable resistance element, and thus, the memory device 200 may also be referred to as a resistive memory device or a resistive random access memory (RRAM or ReRAM) device. For example, the memory device 200 may include, but is not limited to, the cell array 210 having a structure of phase change random access memory (PRAM), ferroelectric random access memory (FRAM), or the like, or may include, but is not limited to, the cell array 210 having a magnetic random access memory (MRAM) structure of spin-transfer torque magnetic random access memory (STT-MRAM), spin torque transfer magnetization switching RAM (Spin-RAM), spin momentum transfer RAM (SMT-RAM), or the like The cell array 210 may include not only the memory cell Mi but also include a reference cell Ri connected to the word line WLi to which the memory cell Mi is also connected. In some example embodiments, the reference cell Ri may have a structure of the memory cell Mi, the structure excluding a variable resistance element, and may also be referred to as a short cell. The memory cell Mi may be connected to the bit line BLj and the source line SLj, and the reference cell Ri may also be connected to a bit line BLr and a source line SLr. As illustrated in FIG. 12, during a read operation, a negative supply voltage VSS may be applied to the memory cell Mi via the source line SLj, and the memory cell Mi may be connected to the read circuit 250 via the bit line BLj. Also, the reference cell Ri may be connected to the reference resistor 260 via the source line SLr and may be connected to the read circuit 250 via the bit line BLr.

The read circuit 250 may include a sense amplifier 251 and first and second current sources 252 and 253. The first current source 252 may generate a first read current $I_{RD1}$, and the first read current $I_{RD1}$ may flow into a negative supply voltage VSS via the bit line BLj, the memory cell Mi, and the source line SLj. The second current source 253 may generate a second read current $I_{RD2}$, and the second read current $I_{RD2}$ may flow into a negative supply voltage VSS via the bit line BLr, the reference cell Ri, the source line SLr, and the reference resistor 260. In some example embodiments, the first read current $I_{RD1}$ and the second read current $I_{RD2}$ may have a same size. A data input signal DIN may have a voltage level generated by resistance of the variable resistance element included in the memory cell Mi and the first read current $I_{RD1}$, and a reference signal REF may have a voltage level generated by the reference resistor 260 and the second read current $I_{RD2}$. Accordingly, before a sensing operation by the sense amplifier 251, not only the data input signal DIN but also the reference signal REF may be developed. The sense amplifier 251 may amplify a difference between the voltage level of the data input signal DIN and the voltage level of the reference signal REF, thereby generating a data output signal DOUT.

The controller 230 may generate a sensing enable signal SEN for controlling the sensing operation by the sense amplifier 251. The sensing enable signal SEN may be provided to the sense amplifier 251 and the control signal generator 240. The control signal generator 240 may include a replica circuit 241 obtained by replicating at least some portions of the sense amplifier 251, and an amplifying circuit 242, and the replica circuit 241 may generate an output signal OUT from the reference signal REF and the sensing enable signal SEN. The amplifying circuit 242 may generate an amplification enable signal AEN by amplifying (e.g., inverting) the output signal OUT of the replica circuit 241, and may provide the amplification enable signal AEN to the sense amplifier 251.

Figure 13:
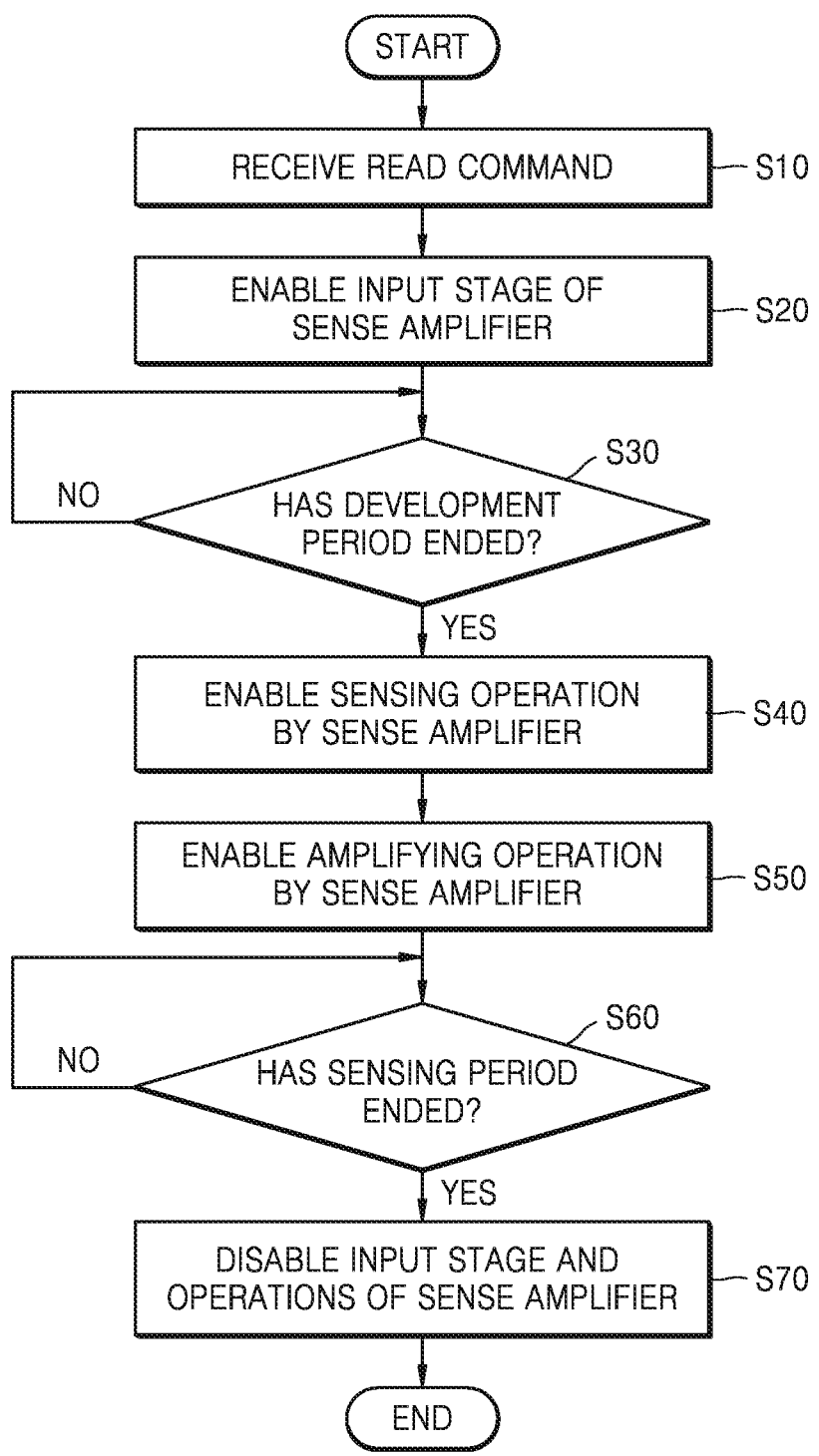
FIG. 13 is a flowchart illustrating a read method of a memory device, according to an example embodiment.

FIG. 13 is a flowchart illustrating a read method of a memory device, according to an example embodiment. For example, the read method of FIG. 13 may be performed by the memory device 100 of FIG. 1. Hereinafter, FIG. 13 will now be described with reference to FIGS. 1 and 10.

Referring to FIG. 13, in operation S10, an operation of receiving a read command may be performed. For example, the memory device 100 may receive the read command and an address. The controller 130 may recognize the read command and may generate control signals for a read operation. Also, the row decoder 120 may select the memory cell M by activating the word line WLi corresponding to the address.

In operation S20, an operation of enabling the input stage of the sense amplifier 151 may be performed. For example, the controller 130 may generate the input enable signal SAEN that is activated at time t91. In response to the activated input enable signal SAEN, power may be supplied to the input stage (e.g., the first and second transistors T1 and T2 of FIG. 8) of the sense amplifier 151.

In operation S30, an operation of determining whether a development period has been ended may be performed. For example, the controller 130 may include a counter, and may count a clock signal from time t91. When a counted value reaches a preset value, the controller 130 may determine that the development period has been ended. When the development period has been ended, operation S40 may be performed thereafter.

In operation S40, an operation of enabling the sensing operation by the sense amplifier 151 may be performed. For example, the controller 130 may generate the sensing enable signal SEN that is activated at time t92 when the development period has been ended. In response to the activated sensing enable signal SEN, the sensing operation by the sense amplifier 151 may be performed.

In operation S50, an operation of enabling the amplifying operation by the sense amplifier 151 may be performed. For example, the control signal generator 140 may include the replica circuit obtained by replicating at least some portions of the sense amplifier 151, and may emulate an output from the sense amplifier 151. Accordingly, the control signal generator 140 may generate the amplification enable signal AEN activated at time t93, based on an output signal OUT from the replica circuit, wherein a level of the output signal OUT is changed after the sensing enable signal SEN is activated.

In operation S60, an operation of determining whether a sensing period has been ended may be performed. For example, the controller 130 may include the counter, and may count a clock signal from time t92. When a counted value reaches a preset value, the controller 130 may determine that the sensing period has been ended. When the sensing period has been ended, operation S70 may be performed thereafter.

In operation S70, an operation of disabling the input stage and operations of the sense amplifier 151 may be performed. For example, the controller 130 may generate the input enable signal SAEN and the sensing enable signal SEN, which are inactivated at time t94 when the sensing period has been ended. Accordingly, the input stage and the sensing operation of the sense amplifier 151 may be disabled. Also, the control signal generator 140 may generate the inactivated amplification enable signal AEN, in response to the inactivated sensing enable signal SEN, and the amplifying operation by the sense amplifier 151 may be disabled.

Figure 14:
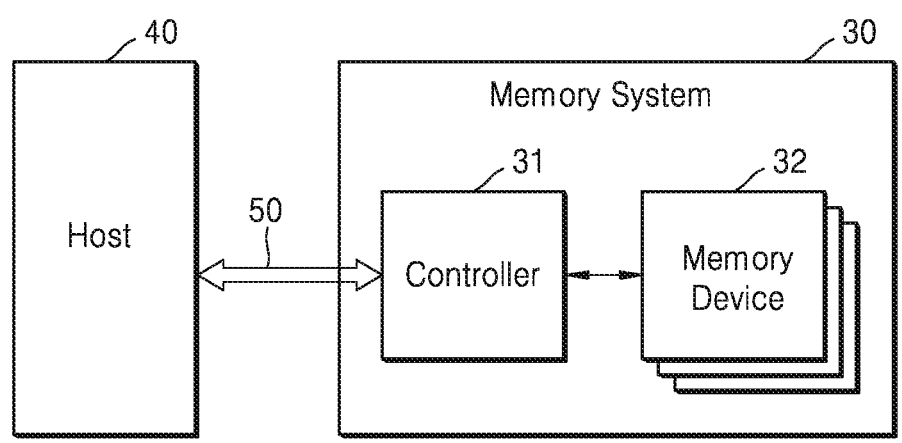
FIG. 14 is a block diagram illustrating a memory system including a memory device, according to an example embodiment.

FIG. 14 is a block diagram illustrating a memory system 30 including a memory device 32, according to an example embodiment. As illustrated in FIG. 14, the memory system 30 may communicate with a host 40 and may include a controller 31 and the memory device 32.

An interface 50 via which the memory system 30 communicates with the host 40 may use an electrical signal and/or an optical signal and may be implemented as, but is not limited to, a serial advanced technology attachment (SATA) interface, a SATA express (SATAe) interface, a serial attached small computer system interface; serial attached SCSI (SAS), a peripheral component interconnect express (PCIe) interface, a non-volatile memory Express (NVMe) interface, or an advanced host controller interface (AHCI), or a combination thereof.

In some example embodiments, the memory system 30 may be removably combined with the host 40, thereby communicating with the host 40. The memory device 32, as a resistive memory, may be a non-volatile memory, and the memory system 30 may also be referred to as a storage system. For example, the memory system 30 may be implemented as, but is not limited to, a solid-state drive or solid-state disk (SSD), an embedded SSD (eSSD), a multimedia card (MMC), an embedded multimedia card (eMMC), or the like.

The controller 31 may control the memory device 32, in response to a request received from the host 40 via the interface 50. For example, the controller 31 may write data to the memory device 32, the data being received with a write request in response to the write request, and may provide data stored in the memory device 32 to the host 40, in response to a read request.

The memory system 30 may include at least one memory device 32, and the memory device 32 may include a control signal generator configured to generate a control signal during a read operation. As described above, the control signal generator may generate an activated amplification enable signal at a time delayed from a time when a sensing enable signal is activated, and a delay between the sensing enable signal and the amplification enable signal may be improved or optimized. Accordingly, regardless of variations in a process, a voltage, temperature, or the like, a value stored in a memory cell may be more rapidly and/or more accurately read. As a result, an operating speed and/or operation reliability of the memory system 30 may be improved.

Figure 15:
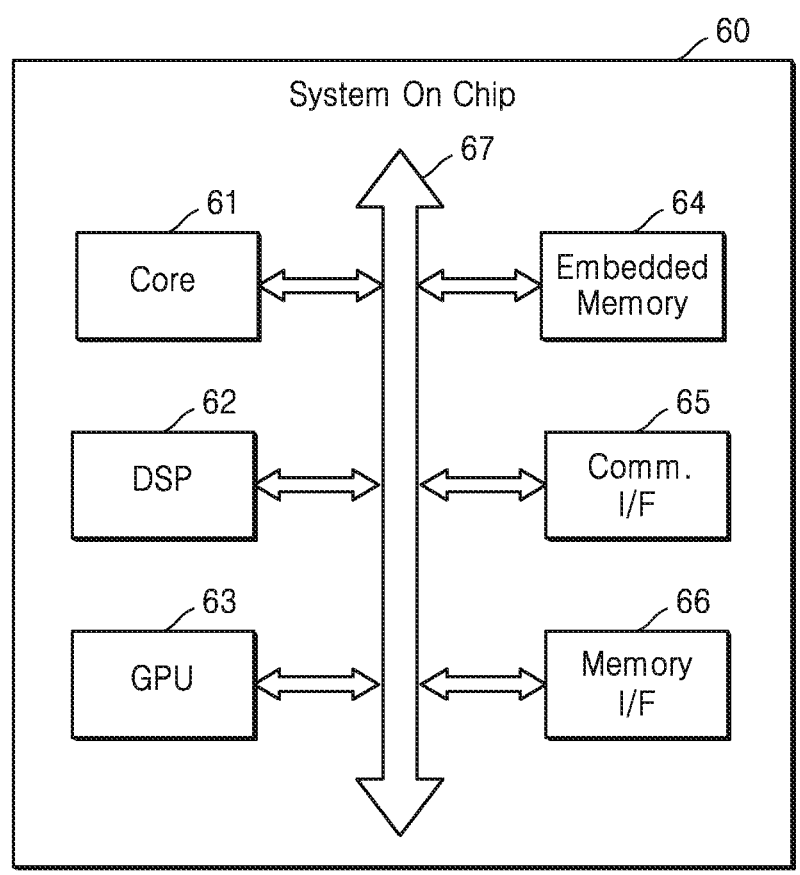
FIG. 15 is a block diagram illustrating a System on Chip (SoC) including a memory device, according to an example embodiment.

FIG. 15 is a block diagram illustrating a System on Chip (SoC) 60 including a memory device, according to an example embodiment. The SoC 60 may refer to an integrated circuit where components of a computing system or other electronic systems are integrated. For example, an application processor (AP) as one of the SoC 60 may include components for a processor and other functions. As illustrated in FIG. 15, the SoC 60 may include a core 61, a digital signal processor (DSP) 62, a graphics processing unit (GPU) 63, an embedded memory 64, a communication interface 65, and/or a memory interface 66. Components of the SoC 60 may communicate with each other via a bus 67.

The core 61 may process instructions and may control operations of the components included in the SoC 60. For example, the core 61 may, by processing a series of instructions, drive an operating system and execute applications on the operating system. The DSP 62 may generate useful data by processing a digital signal, e.g., a digital signal provided from the communication interface 65. The GPU 63 may generate data for an image output, via a display device, from image data provided from the embedded memory 64 or the memory interface 66, and may encode the image data.

The embedded memory 64 may store data required for the core 61, the DSP 62, and the GPU 63 to operate. The embedded memory 64 may include a control signal generator according to one or more example embodiments of the inventive concepts, and thus, a value stored in a memory cell of the embedded memory 64 may be more rapidly and/or more accurately read, regardless of variations in a process, a voltage, temperature, or the like. As a result, an operating speed and/or operation reliability of the SoC 60 may be improved.

The communication interface 65 may provide an interface for a communication network or a one-to-one communication. The memory interface 66 may provide an interface for an external memory of the SoC 60, e.g., an interface for dynamic random access memory (DRAM), a flash memory, or the like.

While the inventive concepts have been particularly shown and described with reference to example embodiments thereof, it will be understood by those of ordinary skill in the art that various changes in form and details may be made therein without departing from the spirit and scope of the inventive concepts as defined by the appended claims. The example embodiments should be considered in descriptive sense only and not for purposes of limitation. Therefore, the scope of the inventive concepts is defined not by the detailed description of the inventive concepts but by the appended claims, and all differences within the scope will be construed as being included in the inventive concepts.

What is claimed is:

1. A control signal generator for a sense amplifier, the control signal generator comprising:
   a replica circuit comprising replica transistors corresponding to at least some transistors among a plurality of transistors comprised in the sense amplifier, and configured to receive at least one input signal of the sense amplifier and a first control signal for enabling a sensing operation by the sense amplifier; and
   an amplifying circuit configured to output, by amplifying an output signal from the replica circuit, a second control signal for enabling an amplifying operation by the sense amplifier after the sensing operation is enabled.

2. The control signal generator of claim 1, wherein
   the sense amplifier is configured to receive a reference signal and a data input signal that varies according to data stored in a memory cell, and
   the replica circuit is further configured to commonly receive the reference signal.

3. The control signal generator of claim 1, wherein the replica circuit comprises a replica transistor that corresponds to an amplification enable transistor of the sense amplifier which receives the second control signal, and is configured to receive a signal equal to the second control signal that is inactivated.

4. The control signal generator of claim 1, wherein the replica circuit comprises a replica transistor that corresponds to an equalization transistor of the sense amplifier which equalizes a differential output signal in response to the first control signal that is activated, and is configured to receive a signal equal to the activated first control signal.

5. The control signal generator of claim 1, wherein the replica circuit comprises replica transistors that correspond to reset transistors of the sense amplifier which reset a differential output signal in response to the first control signal that is activated, and are configured to receive the first control signal.

6. The control signal generator of claim 1, wherein the replica circuit is further configured to receive a third control signal for enabling input transistors of the sense amplifier which receive the at least one input signal.

7. The control signal generator of claim 1, wherein
the replica circuit comprises replica transistors corresponding to amplification transistors of the sense amplifier, the amplification transistors being for the amplifying operation, and
the amplifying circuit comprises transistors having respective same sizes as the amplification transistors.

8. The control signal generator of claim 1, wherein the amplifying circuit comprises an inverter configured to output the second control signal by inverting the output signal from the replica circuit.

9. A control signal generator for a sense amplifier, the control signal generator comprising:
a replica circuit comprising replica transistors corresponding to transistors comprised in the sense amplifier, and configured to generate an output signal for emulating an output from the sense amplifier, in response to a first control signal for enabling a sensing operation by the sense amplifier; and
an amplifying circuit configured to output, by amplifying the output signal from the replica circuit, a second control signal for enabling an amplifying operation by the sense amplifier after the sensing operation is enabled.

10. The control signal generator of claim 9, wherein
the sense amplifier is configured to receive a reference signal and a data input signal that varies according to data stored in a memory cell, and
the replica circuit is further configured to commonly receive the reference signal.

11. The control signal generator of claim 9, wherein the amplifying circuit is further configured to amplify the output signal from the replica circuit when the output signal from the replica circuit corresponds to the output from the sense amplifier, wherein the output provides a maximum gain by amplification transistors of the sense amplifier and the amplification transistors are for the amplifying operation.

12. A memory device comprising:
a memory cell;
a sense amplifier configured to sense and amplify a data input signal that varies according to data stored in the memory cell;
a controller configured to generate a first control signal for enabling a sensing operation by the sense amplifier; and
a control signal generator configured to generate, from the first control signal, a second control signal for enabling an amplifying operation by the sense amplifier,
wherein the control signal generator comprises a replica circuit corresponding to the sense amplifier, and an amplifying circuit configured to generate the second control signal by amplifying an output signal from the replica circuit.

13. The memory device of claim 12, wherein
the sense amplifier is further configured to receive a reference signal and the data input signal, and
the replica circuit is configured to commonly receive the reference signal.

14. The memory device of claim 13, wherein
the memory cell is configured to store data according to a resistance value of a variable resistance element comprised in the memory cell and provide, to the sense amplifier, a read voltage as the data input signal, and
the memory device further comprises a reference circuit that comprises a reference resistor and is configured to generate a reference voltage as the reference signal.

15. The memory device of claim 12, wherein
the sense amplifier comprises an amplification enable transistor configured to receive the second control signal, and
the replica circuit comprises a replica transistor corresponding to the amplification enable transistor, the replica transistor being configured to receive a signal equal to the second control signal that is inactivated.

16. The memory device of claim 12, wherein
the sense amplifier comprises an equalization transistor configured to equalize a differential output signal, in response to the first control signal that is activated, and
the replica circuit comprises a replica transistor corresponding to the equalization transistor, the replica transistor being configured to receive a signal equal to the activated first control signal.

17. The memory device of claim 12, wherein
the sense amplifier comprises reset transistors configured to reset a differential output signal, in response to the first control signal that is activated, and
the replica circuit comprises replica transistors corresponding to the reset transistors, the replica transistors being configured to receive the first control signal.

18. The memory device of claim 12, wherein
the sense amplifier comprises an input transistor configured to receive the data input signal,
the controller is further configured to generate a third control signal for enabling the input transistor, and
the replica circuit is configured to receive the third control signal.

19. The memory device of claim 18, wherein the controller is further configured to activate the second control signal after activating the third control signal.

20. The memory device of claim 12, wherein
the sense amplifier comprises amplification transistors for the amplifying operation,
the replica circuit comprises replica transistors corresponding to the amplification transistors, and
the amplifying circuit comprises transistors having respective same sizes as the amplification transistors.

* * * * *